United States Patent
Wu

(10) Patent No.: US 7,695,239 B2
(45) Date of Patent: Apr. 13, 2010

(54) END EFFECTOR GRIPPER ARMS HAVING CORNER GRIPPERS WHICH REORIENT RETICLE DURING TRANSFER

(75) Inventor: Kung Chris Wu, Sunyvale, CA (US)

(73) Assignee: Fortrend Engineering Corporation, Sunnyvale, CA (US)

(*) Notice: Subject to any disclaimer, the term of this patent is extended or adjusted under 35 U.S.C. 154(b) by 876 days.

(21) Appl. No.: 10/891,406

(22) Filed: Jul. 14, 2004

(65) Prior Publication Data

US 2005/0013684 A1  Jan. 20, 2005

Related U.S. Application Data

(60) Provisional application No. 60/486,968, filed on Jul. 14, 2003.

(51) Int. Cl.
  *H01L 21/68* (2006.01)
(52) U.S. Cl. .................. 414/783; 414/936; 414/938; 414/941; 414/741; 901/31; 294/119.1; 294/81.4
(58) Field of Classification Search ............... 414/783, 414/935, 744.3, 938, 940, 746.3; 204/298.18; 294/16, 119.1
  See application file for complete search history.

(56) References Cited

U.S. PATENT DOCUMENTS

| 3,888,362 | A | * | 6/1975 | Fletcher et al. ............. 414/620 |
| 4,042,122 | A | * | 8/1977 | Espy et al. .................. 414/728 |
| 4,765,011 | A | * | 8/1988 | Leeper ........................ 12/1 A |
| 5,421,889 | A | * | 6/1995 | Pollock et al. .............. 118/719 |
| 5,885,045 | A |   | 3/1999 | Rush |
| 5,984,610 | A |   | 11/1999 | Rush et al. |
| 6,086,323 | A |   | 7/2000 | Rush et al. |
| 6,193,459 | B1 |   | 2/2001 | Rush |
| 6,338,409 | B1 |   | 1/2002 | Neary |

* cited by examiner

*Primary Examiner*—Gregory W Adams
(74) *Attorney, Agent, or Firm*—Donald E. Schreiber

(57) ABSTRACT

The present invention is a pod opener having an end effector which:
  a. grips and releases a reticle supported above the base of a pod; and
  b. while transferring the reticle between the base of the pod and an adjacent IC photolithography tool, reorients the reticle.

In one embodiment, the pod opener reorients the reticle by rotating it about a single axis disposed substantially perpendicular to its patterned surface. In another embodiment, the present invention is a pod opener which while transferring the reticle between the base of the pod and an adjacent IC photolithography tool, in addition to effecting rotation substantially perpendicular to a reticle's patterned surface, also turns the reticle over so a patterned surface of the reticle is oriented for proper focus within the IC photolithography tool.

4 Claims, 4 Drawing Sheets

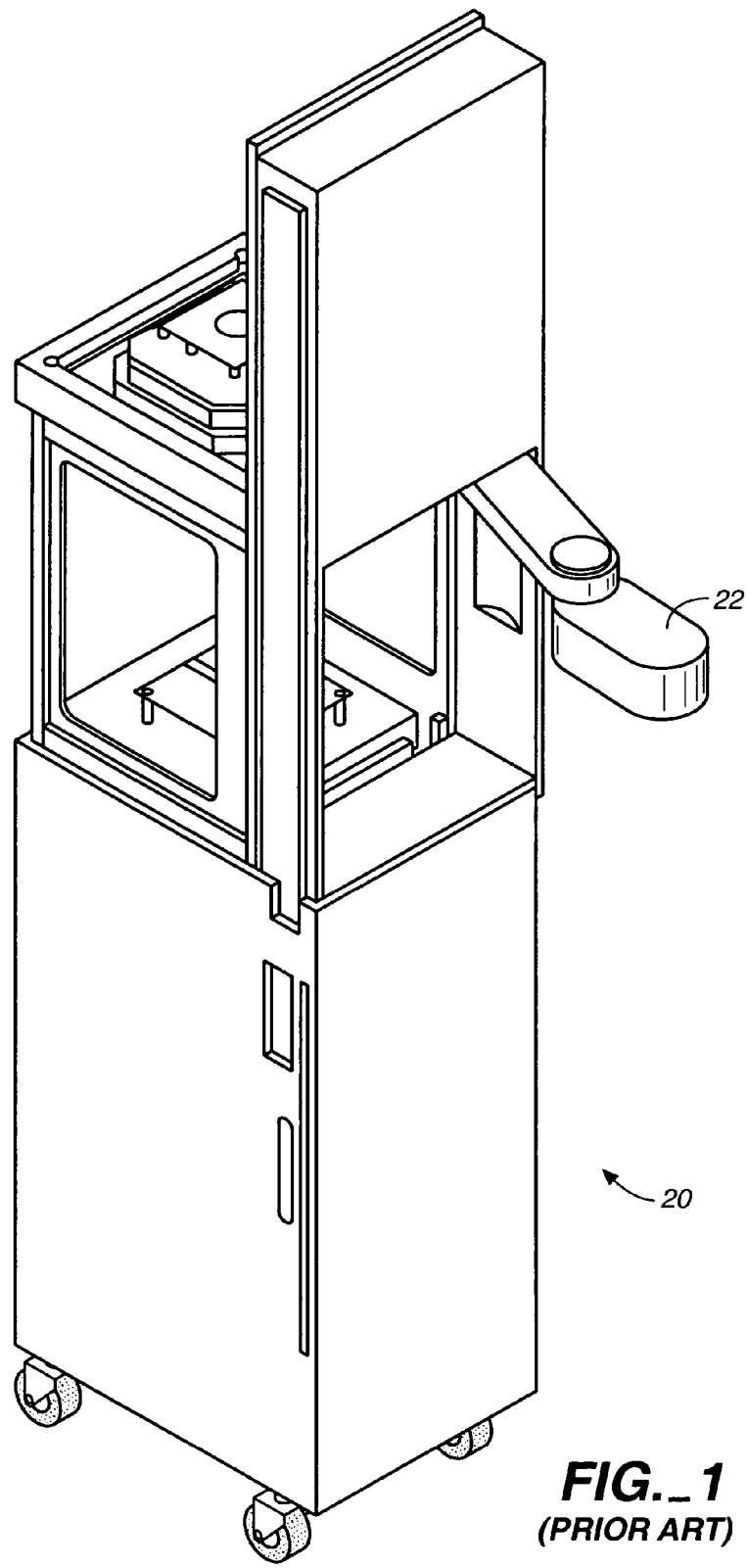
FIG._1
(PRIOR ART)

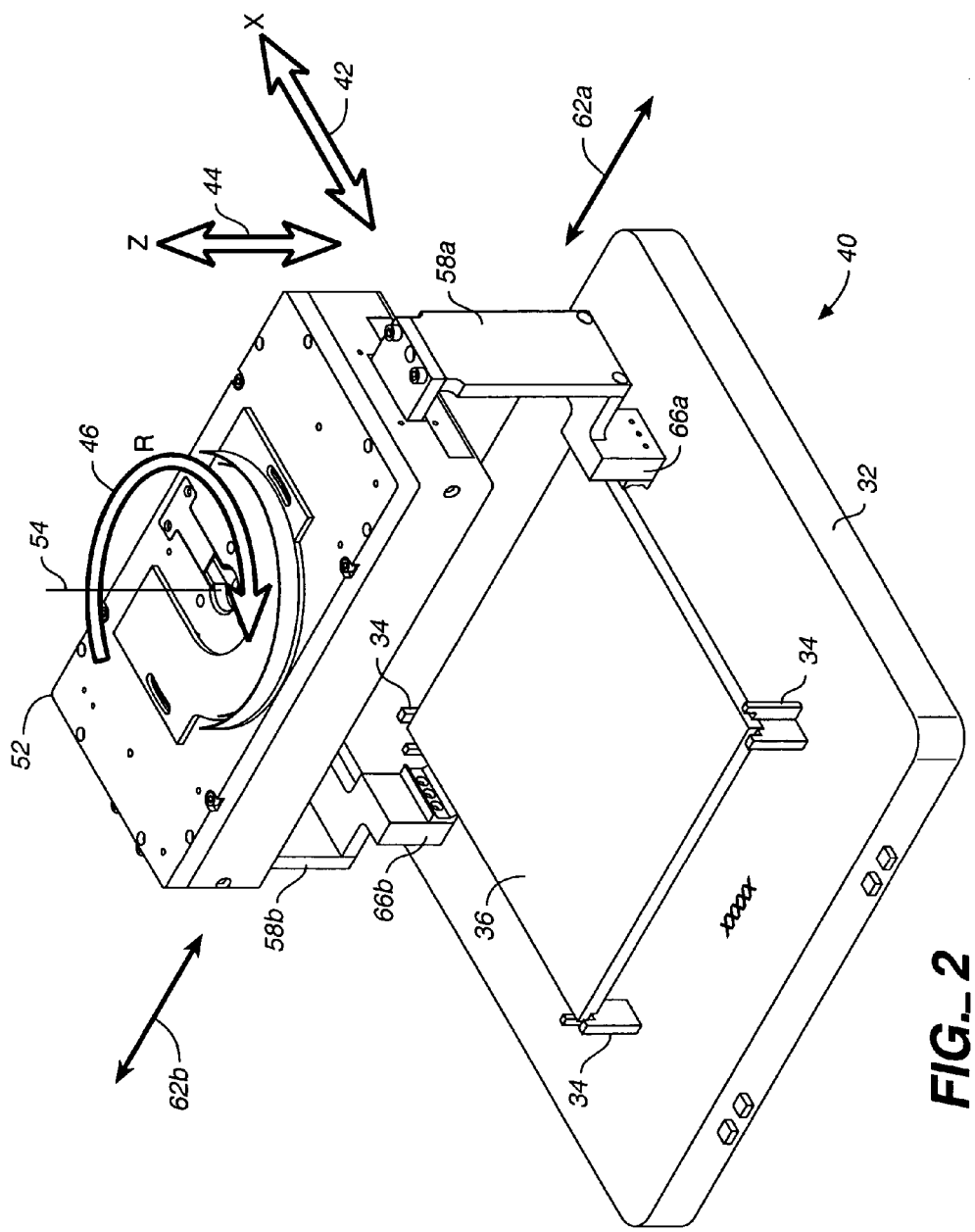
FIG._2

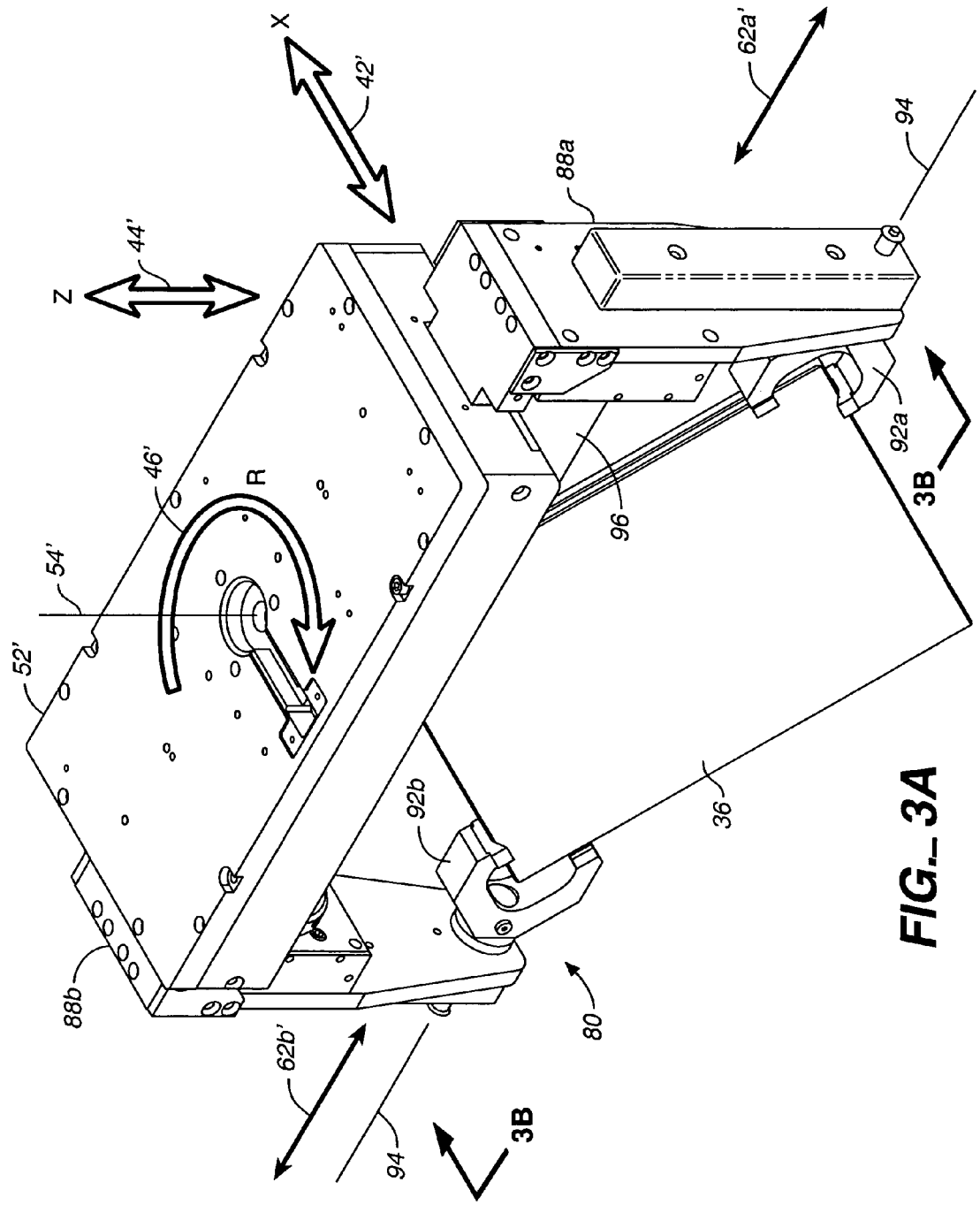
FIG._3A

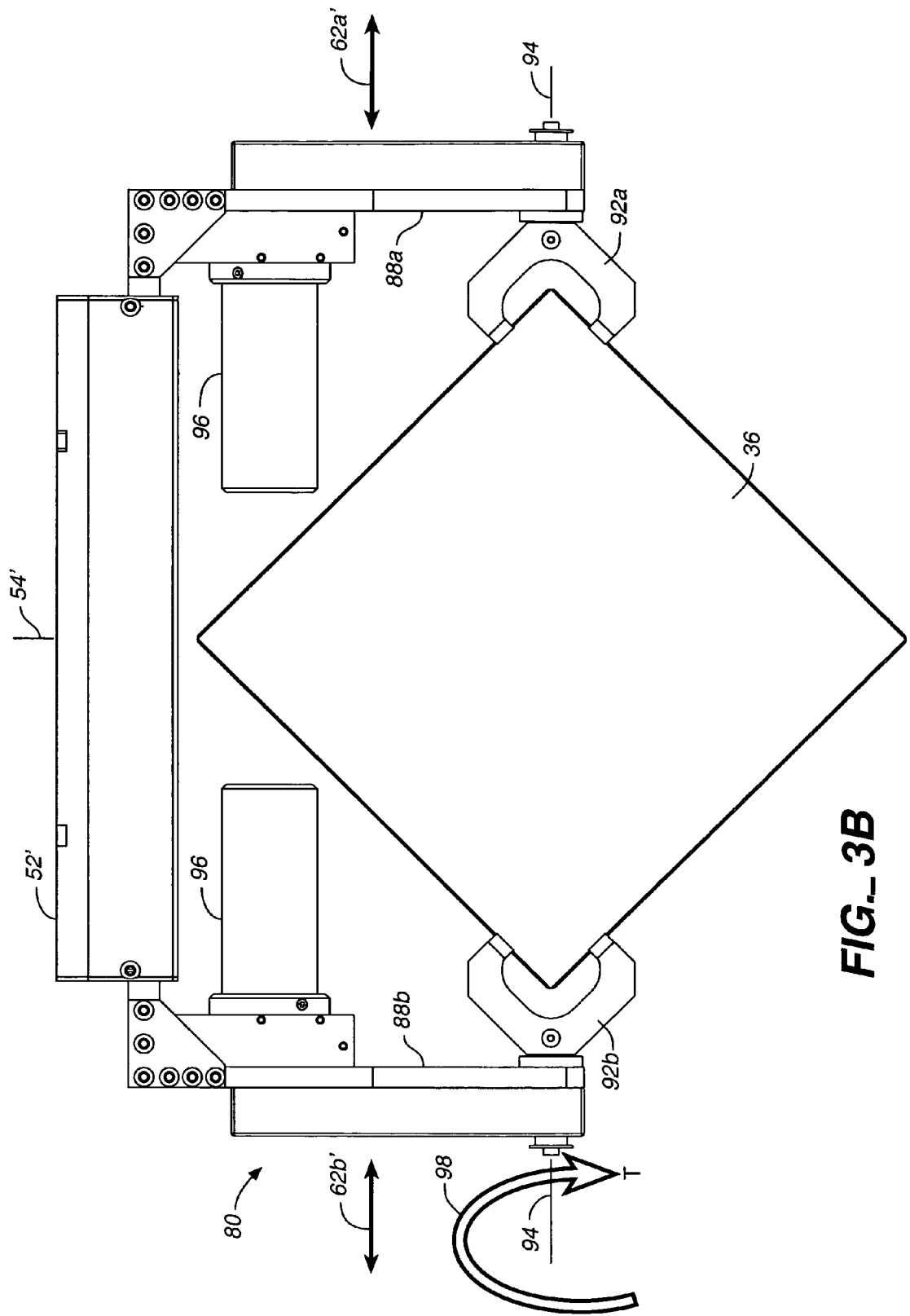
FIG._3B

END EFFECTOR GRIPPER ARMS HAVING CORNER GRIPPERS WHICH REORIENT RETICLE DURING TRANSFER

CLAIM OF PROVISIONAL APPLICATION RIGHTS

This application claims the benefit of U.S. Provisional Patent Application No. 60/486,968 filed on Jul. 14, 2003.

BACKGROUND OF THE INVENTION

1. Field of the Invention

The present invention relates generally to the technical field of automated tools used for integrated circuit fabrication and, more particularly, to automated reticle handling tools.

2. Description of the Prior Art

Presently, conventional processes for manufacturing integrated circuits ("ICs") include a number of process steps in which a surface of a semiconductor wafer is first coated with a thin layer of a photo-resist material after which the photo-resist material is irradiated with short wavelength light to form a latent image of a pattern in the photo-resist layer. A subsequent processing step develops the latent image thereby leaving patterned photo-resist material on a wafer's surface. In processing a semiconductor wafer to fabricate ICs, the preceding procedure for establishing patterned photo-resist material on a wafer's surface may be repeated dozens of times. The pattern formed in the photo-resist layer on a wafer's surface generally differs for each of the dozens of photo-resist exposures performed during IC fabrication. Thus, fabricating a particular type of IC may require a dozen or more reticles each having a different pattern.

In irradiating photo-resist material, the short wavelength light used in forming the latent image passes first through a reticle before impinging upon the thin layer of photo-resist material. In general, reticles used in IC fabrication are made from a thick, planar, rectangularly or square shaped pieces of glass. The reticle is opaque in those areas of the pattern where the reticle blocks the short wavelength light from impinging upon the thin layer of photo-resist material. A reticle's opaque pattern is usually formed by a layer of patterned metal, e.g. chromium, coated on one surface of the piece of glass forming the reticle.

Because reticles are high precision optical devices, they are comparatively expensive. Presently each individual reticle can cost between $5,000.00 and $30,000.00 depending upon the size of the smallest feature in the pattern to be formed in the photo-resist layer on the wafer's surface. Consequently, a complete set of reticles needed for fabricating a single type of IC may cost several hundred thousand dollars. Correspondingly, the photolithography equipment which receives both the reticle and the wafer for exposing the photo-resist layer to short wavelength light is also comparatively expensive costing several million dollars.

A typical IC factory, commonly referred to as a "fab," may include several different models of photolithography equipment from different manufacturers, or different models of photolithography equipment from the same manufacturer. While these differing models of photolithography equipment will all accept the same reticles used in manufacturing a single type of IC, previously there existed no standard holder for a single reticle or cassette for holding a set of reticles while reticles are automatically loaded into and removed from the photolithography equipment. That is, individual photolithography equipment manufacturers have arbitrarily selected unique configurations for holders and cassettes which carry reticles while reticles are loaded into and removed from photolithography equipment. Thus, worldwide presently there are in daily use in IC fabs reticle holders and cassettes having dozens of different, incompatible configurations.

In an effort to standardize reticle cassettes among the products of various photolithography equipment manufacturers, the Semiconductor Equipment and Materials International ("SEMI") has adopted a standard, i.e. SEMI E100-0302, entitled "Specification for a Reticle SMIF Pod (RSP) Used to Transport and Store 6 Inch or 230 mm Reticles." The SEMI E100-0302 standard is hereby incorporated by reference. As implied by the name of the SEMI standard, the configuration of RSP is an adaptation of a previously existing Standard Mechanical InterFace ("SMIF") pod which is widely used in IC fabs for carrying 8-inch semiconductor wafers during wafer processing. While it appears likely that sometime in the future all photolithography equipment will accept the RSP for holding reticles while individual reticles are automatically loaded into and removed from the photolithography equipment, due to the presently existing large installed base of photolithography equipment such a situation is unlikely to occur in the immediately foreseeable future. Thus, for the foreseeable future a need will continue to exist for automatically moving reticles into and out of uniquely configured photolithography equipment.

Some photolithography tools used in patterning blank reticles accept and deliver cassettes which carry a number of reticles. Some IC fabrication photolithography tools, as contrasted with photolithography tools used in patterning blank reticles, provide storage within the tool for a relatively small inventory of reticles. Other IC fabrication photolithography tools are unable to store any reticles. However, whether an IC fabrication photolithography tool provides or lacks storage for an inventory of reticles, such tools are, in general, configured for receiving or delivering single reticles one at a time.

Because IC fabs store reticles in various differing ways when they are not being used for producing patterned photo-resist material on a wafer's surface, presently reticles are manually delivered to and received from IC fabrication photolithography tools. Manually exchanging reticles with IC fabrication photolithography tools insures that, regardless of how reticles are stored when they are not in use, they will be oriented properly in the tool for patterning photo-resist material on a wafer's surface.

As is well known to those skilled in the art of IC fabrication, contamination must be reduced as much as practicable, or even eliminated if possible, within an IC fab. For example, to reduce reticle contamination they may be stored with their patterned surface facing downward. However, proper focus within a photolithography tool may require reorienting the reticle's patterned surface. Properly designed equipment for automatically transferring reticles into and out of photolithography equipment which is capable of reorienting them can reduce or eliminate a possible source of contamination due to manual handling.

Devices used for exchanging with an IC processing tool cassettes which carry a number of semiconductor wafers have been used routinely for a number of years in IC fabs. U.S. Pat. Nos. 5,984,610 and 6,086,323 ("the '610 and '323 patents"), that are incorporated herein by reference, describe such equipment which is frequently identified by the name "pod opener." Pod openers such as those described in these patents exchange with an IC processing tool a cassette carrying a number of semiconductor wafers that are initially enclosed within a SMIF pod. In general, a pod opener accepts a sealed SMIF pod and then opens the pod to expose any wafer cassette carried therein while constantly maintaining an ultraclean environment around the cassette. After the pod opener exposes the wafer cassette, a robotic arm having an end effector adapted for gripping the cassette exchanges the cassette with an IC processing tool. In general, the semiconductor wafers are oriented horizontally when the cassette is enclosed within the SMIF pod. For that reason, whenever possible IC processing tools are designed to exchange horizontally oriented, individual semiconductor wafers with the wafer cassette. However, depending upon requirements of particular IC processing tools, as described in U.S. Pat. No. 5,885,045 the robotic arm and end effector included in a pod opener may be adapted for reorienting the cassette so the semiconductor wafers are oriented vertically. However, conventional pod openers are not usually equipped for handling and reorienting individual silicon wafers.

BRIEF SUMMARY OF THE INVENTION

An object of the present invention is to provide a pod opener that is adapted for transferring a reticle between a base of a pod and an adjacent IC photolithography tool.

Another object of the present invention is to provide a pod opener that is adapted for reorienting a reticle while transferring it between a base of a pod and an adjacent IC photolithography tool.

Another object of the present invention is to provide a pod opener that is adapted for gripping a reticle so its rotation, while the reticle is transported between a base of a pod and an adjacent IC photolithography tool, effects a displacement of the reticle which exceeds that provided solely by movement of an arm included in the pod opener.

Another object of the present invention is to provide a pod opener that is adapted for reorienting a reticle while transferring it between a base of a pod and an adjacent IC photolithography tool so a patterned surface of the reticle is oriented for proper focus within the adjacent IC photolithography tool.

Another object of the present invention is to provide a method for using an IC photolithography tool for establishing patterned photo-resist material on surfaces of silicon wafers wherein a pod opener transports a reticle between a base of a pod and an adjacent IC photolithography tool while reorienting the reticle.

Briefly, in one embodiment the present invention is a pod opener having an end effector which:
  a. grips and releases a reticle supported above the base of a pod; and
  b. while transferring the reticle between the base of the pod and an adjacent IC photolithography tool, reorients the reticle. In this particular embodiment, the pod opener reorients the reticle by rotating it about a single axis disposed substantially perpendicular to a patterned surface of the reticle.

In another embodiment, the present invention is a pod opener having an end effector which:
  a. grips and releases a reticle supported above the base of a pod; and
  b. while transferring the reticle between the base of the pod and an adjacent IC photolithography tool:
    i. reorients the reticle by rotating it about a single axis disposed substantially perpendicular to a patterned surface of the reticle; and
    ii. turns the reticle over so a patterned surface of the reticle is oriented for proper focus within the IC photolithography tool.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 1 is a perspective view depicting a pod opener of the prior art including an illustration of the pod opener's arm;

FIG. 2 is a perspective view depicting one embodiment of a one degree of freedom ("DOF") end effector in accordance with the present invention, as may be secured to a distal end of the prior art pod opener's arm, together with a reticle that is supported above a base of a SMIF pod;

FIG. 3A is perspective view depicting another embodiment of a two (2) DOFs end effector in accordance with the present invention, as may also be secured to a distal end of the prior art pod opener's arm, for supporting a reticle; and FIG. 3B is a perspective view depicting end effector illustrated in FIG. 3A taken along the line 3B-3B therein.

DETAILED DESCRIPTION

FIG. 1 illustrates a pod opener such as that described in the '610 and '323 patents that is identified by the general reference character 20. The pod opener 20 includes a robotic arm 22 beneath a distal end of which depends an end effector, not illustrated in FIG. 1. As described in the '610 and '323 patents, the robotic arm 22 is adapted for moving an end effector attached to the distal end thereof horizontally back-and-forth along a substantially linear path from a location within the pod opener 20 to a location within an abutting IC photolithography tool, not illustrated in FIG. 1. As also described in the '610 and '323 patents, the pod opener 20 is adapted for raising and lowering the robotic arm 22 vertically.

FIG. 2 depicts a base 32 of a SMIF pod above which project four (4) posts 34, only three (3) of which are visible in FIG. 2. The posts 34 are arranged to engage four (4) corners of a reticle 36 for supporting reticle 36 above the base 32.

FIG. 2 also illustrates a first embodiment of an end effector in accordance with the present invention referred to by the general reference character 40. In FIG. 2, two arrows 42, 44 respectively indicate X-axis horizontal and Z-axis vertical translation of the end effector 40 effected by the pod opener 20. As indicated in FIG. 2 by a curved arrow 46, the end effector 40 may be energized for rotating an elongated, hollow gripper-support bar 52, that is included in the end effector 40, about a R-axis 54 that is oriented substantially perpendicular to the gripper-support bar 52. Rotation of the gripper-support bar 52 about the R-axis 54 provides the end effector 40 with one (1) DOF in which the gripper-support bar 52 rotates about an axis which is oriented substantially perpendicular to a patterned surface of the reticle 36.

Depending from opposite ends of the gripper-support bar 52 are two gripper arms 58a, 58b. A gripper drive, that is enclosed within the gripper-support bar 52 and therefore not visible in FIG. 2, is energizable for moving the gripper arms 58a, 58b horizontally inward toward and outward from the gripper-support bar 52 and also the R-axis 54 about which the gripper-support bar 52 is rotatable as indicated by arrows 62a, 62b. Such horizontal movements of the gripper arms 58a, 58b permit U-shaped reticle-side grippers 66a, 66b, that are located at nadirs respectively of the gripper arms 58a, 58b, to first grip and then release opposite sides of the reticle 36 for transferring the reticle 36 between a base 32 of a SMIF pod and an adjacent IC photolithography tool.

Rotation of the gripper-support bar 52 about the R-axis 54 permits reorienting the reticle 36 between its position supported above the base 32 within the pod opener 20 and its position within an adjacent IC photolithography tool. By gripping the reticle 36 near one edge thereof as contrasted with near the middle, rotation of the gripper-support bar 52 about the R-axis 54 further increases X-axis displacement of the reticle 36 provided by the pod opener 20 equipped with the end effector 40 beyond that provided solely by the robotic arm 22.

FIGS. 3A and 3B illustrates a second embodiment of an end effector in accordance with the present invention referred to by the general reference character 80. Those elements illustrated in FIGS. 3A and 3B for the end effector 80 that are common to the end effector 40 illustrated in FIG. 2 carry the same reference numeral distinguished by a prime ("'") designation.

Similar to the gripper arms 58a, 58b of the end effector 40, the end effector 80 includes a pair of reticle-rotating arms 88a, 88b that depend from opposite ends of the gripper-support bar 52'. Also similar to the gripper-support bar 52 and gripper arms 58a, 58b illustrated in FIG. 2, the gripper drive enclosed within the gripper-support bar 52' is energizable for moving the reticle-rotating arms 88a, 88b horizontally inward toward and outward from the gripper-support bar 52' and also the R-axis 54' about which the gripper-support bar 52' is rotatable as indicated by arrows 62a', 62b'. Such horizontal movements of the reticle-rotating arms 88a, 88b permit C-shaped reticle-corner grippers 92a, 92b, that are mounted at nadirs respectively of the reticle-rotating arms 88a, 88b, to grip and release opposite corners of the reticle 36 for transferring the reticle 36 between a base 32 of a SMIF pod and an adjacent IC photolithography tool. As indicated by a curved arrow 98, each of the reticle-rotating arms 88a, 88b respectively includes an electric motor 96 for energizing rotation of the reticle-corner grippers 92a, 92b about a T-axis 94 that is aligned colinearly with the reticle-corner grippers 92a, 92b.

Rotation of the reticle-corner grippers 92a, 92b about the T-axis 94 combined with rotation of the gripper-support bar 52' about the R-axis 54' provides the end effector 80 illustrated in FIGS. 3A and 3B with two (2) DOFs. As stated above for the end effector 40 illustrated in FIG. 2, rotation of the end effector 80 about the R-axis 54' permits reorientation of the reticle 36 between its position supported above the base 32 within the pod opener 20 and its position within an adjacent IC photolithography tool. Rotation of the reticle-corner grippers 92a, 92b about the T-axis 94 permits turning the reticle 36 over so the patterned surface thereof may be positioned for proper focus when the IC photolithography tool projects the pattern thereon onto the surface of a semiconductor wafer.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A method for using an IC photolithography tool for establishing patterned photo-resist material on surfaces of silicon wafers, the method comprising the steps of:
   a. receiving a pod which carries a reticle on a base thereof into a pod opener that is located adjacent to the IC photolithography tool and opening the pod, the pod opener including:
      i. an arm that is moveable with respect to the pod's base when the base is received by the pod opener; and
      ii. an end effector attached to a distal end of the arm, the end effector including:
         a gripper-support bar secured to the distal end of the pod opener's arm for rotation with respect to the arm about an axis which is substantially perpendicular to the gripper-support bar;
         a pair of gripper arms which respectively depend from opposite ends of the gripper-support bar and are moveable with respect to the gripper-support bar inward toward and outward from the axis about which the gripper-support bar is rotatable;
         a pair of U-shaped reticle-side grippers, each of the reticle-side grippers being located at nadirs respectively of each of the gripper arms, the U-shaped reticle-side grippers adapting the end effector for gripping a reticle near an edge thereof;
   b. moving the pod opener's arm to dispose the end effector's gripper-support bar over the reticle that is located on the pod's base;
   c. moving the gripper arms inward toward the axis about which the gripper-support bar is rotatable to grip with the reticle-side grippers opposite sides of a reticle near an edge thereof, the reticle being supported above a base of a pod received into the pod opener; and
   d. transferring the reticle between:
      i. the base of the pod; and
      ii. an adjacent IC photolithography tool wherein the reticle is used in establishing patterned photo-resist material on surfaces of silicon wafers,
   while transferring the reticle gripped near an edge thereof, the reticle being reorientable with respect to the pod opener's arm by rotating the gripper-support bar with respect to the pod opener's arm, the gripping of a reticle near an edge thereof further increasing displacement of a reticle to exceed that provided solely by movement of the pod opener's arm.

2. An end effector adapted for attachment to a distal end of an arm that is included in a pod opener, the pod opener being adapted for receiving, opening and closing a pod which carries a reticle on a base thereof, the pod opener's arm being moveable with respect to the pod's base when the base is received by the pod opener, the end effector comprising:
   a gripper-support bar which is securable to the distal end of the pod opener's arm for rotation with respect to the arm about an axis which is substantially perpendicular to the gripper-support bar;
   a pair of reticle-rotating arms which respectively depend from opposite ends of the gripper-support bar and are moveable with respect to the gripper-support bar inward toward and outward from the axis about which the gripper-support bar is rotatable; and
   a pair of C-shaped reticle-corner grippers, each of the reticle-corner grippers being located at nadirs respectively of each of the reticle-rotating arms, movement of the reticle-rotating arms inward toward the axis about which the gripper-support bar is rotatable effecting engagement between the reticle-corner grippers and opposite corners of a reticle supported above a base of a pod received into the pod opener, and movement of the reticle-rotating arms outward from the axis about which the gripper-support bar is rotatable effecting disengagement of a reticle from the reticle-corner grippers, the reticle-corner grippers being rotatable about an axis which is substantially colinear with the reticle-corner grippers;

whereby the end effector adapts the pod opener for:
a. gripping with the reticle-corner grippers a reticle supported above a base of a pod received into the pod opener;
b. transferring a reticle gripped by the reticle-corner grippers between:
   i. the base of the pod; and
   ii. an adjacent IC photolithography tool;
c. reorienting a reticle gripped by the reticle-corner grippers with respect to the pod opener's arm by rotating the gripper-support bar with respect to the pod opener's arm while transferring the reticle between the base of a pod and the adjacent IC photolithography tool; and
d. turning over a reticle gripped by the reticle-corner grippers while transferring the reticle between the base of a pod and the adjacent IC photolithography tool so a patterned surface of the reticle is oriented within the adjacent IC photolithography tool for proper focus.

3. A pod opener adapted for:
a. receiving, opening and closing a pod which carries a reticle on a base thereof; and
b. transferring the reticle between:
   i. the base of the pod; and
   ii. an adjacent IC photolithography tool,
the pod opener comprising:
   an arm that is moveable with respect to the pod's base when the base is received by the pod opener; and
   an end effector attached to a distal end of the arm, the end effector including:
      a gripper-support bar secured to the distal end of the pod opener's arm for rotation with respect to the arm about an axis which is substantially perpendicular to the gripper-support bar;
      a pair of reticle-rotating arms which respectively depend from opposite ends of the gripper-support bar and are moveable with respect to the gripper-support bar inward toward and outward from the axis about which the gripper-support bar is rotatable; and
      a pair of C-shaped reticle-corner grippers, each of the reticle-corner grippers being located at nadirs respectively of each of the reticle-rotating arms, movement of the reticle-rotating arms inward toward the axis about which the gripper-support bar is rotatable effecting engagement between the reticle-corner grippers and opposite corners of a reticle supported above a base of a pod received into the pod opener, and movement of the reticle-rotating arms outward from the axis about which the gripper-support bar is rotatable effecting disengagement of a reticle from the reticle-corner grippers, the reticle-corner grippers being rotatable about an axis which is substantially colinear with the reticle-corner grippers;
whereby the pod opener is adapted for:
a. gripping with the reticle-side grippers a reticle supported above a base of a pod received into the pod opener;
b. transferring a reticle gripped by the reticle-side grippers between:
   i. the base of the pod; and
   ii. an adjacent IC photolithography tool;
c. reorienting a reticle gripped by the reticle-corner grippers with respect to the pod opener's arm by rotating the gripper-support bar with respect to the pod opener's arm while transferring the reticle between the base of a pod and the adjacent IC photolithography tool; and
d. turning over a reticle gripped by the reticle-corner grippers while transferring the reticle between the base of a pod and the adjacent IC photolithography tool so a patterned surface of the reticle is oriented within the adjacent IC photolithography tool for proper focus.

4. A method for using an IC photolithography tool for establishing patterned photo-resist material on surfaces of silicon wafers, the method comprising the steps of:
a. receiving a pod which carries a reticle on a base thereof into a pod opener that is located adjacent to the IC photolithography tool and opening the pod, the pod opener including:
   i. an arm that is moveable with respect to the pod's base when the base is received by the pod opener; and
   ii. an end effector attached to a distal end of the arm, the end effector including:
      a gripper-support bar secured to the distal end of the pod opener's arm for rotation with respect to the arm about an axis which is substantially perpendicular to the gripper-support bar;
      a pair of reticle-rotating arms which respectively depend from opposite ends of the gripper-support bar and are moveable with respect to the gripper-support bar inward toward and outward from the axis about which the gripper-support bar is rotatable; and
      a pair of C-shaped reticle-corner grippers, each of the reticle-corner grippers being located at nadirs respectively of each of the reticle-rotating arms, the reticle-corner grippers being rotatable about an axis which is substantially colinear with the reticle-corner grippers;
b. moving the pod opener's arm to dispose the end effector's gripper-support bar over the reticle that is located on the pod's base;
c. moving the reticle-rotating arms inward toward the axis about which the gripper-support bar to is rotatable grip with the reticle-corner grippers opposite corners of a reticle supported above a base of a pod received into the pod opener; and
d. transferring the reticle between:
   i. the base of the pod; and
   ii. an adjacent IC photolithography tool wherein the reticle is used in establishing patterned photo-resist material on surfaces of silicon wafers,
while transferring the reticle, the reticle being:
   i. reorientable with respect to the pod opener's arm by rotating the gripper-support bar with respect to the pod opener's arm; and
   ii. turnable so a patterned surface of the reticle is oriented within the adjacent IC photolithography tool for proper focus.

* * * * *